(12) United States Patent
Chen et al.

(10) Patent No.: US 11,342,273 B2
(45) Date of Patent: May 24, 2022

(54) PACKAGE STRUCTURE OF INTEGRATED PASSIVE DEVICE AND MANUFACTURING METHOD THEREOF, AND SUBSTRATE

(71) Applicant: Zhuhai ACCESS Semiconductor Co., Ltd, Zhuhai (CN)

(72) Inventors: Xianming Chen, Zhuhai (CN); Yejie Hong, Zhuhai (CN); Benxia Huang, Zhuhai (CN); Lei Feng, Zhuhai (CN); Bingsen Xie, Zhuhai (CN)

(73) Assignee: ZHUHAI ACCESS SEMICONDUCTOR CO., LTD, Zhuhai (CN)

( * ) Notice: Subject to any disclaimer, the term of this patent is extended or adjusted under 35 U.S.C. 154(b) by 0 days.

(21) Appl. No.: 16/948,536

(22) Filed: Sep. 23, 2020

(65) Prior Publication Data
US 2021/0407922 A1    Dec. 30, 2021

(30) Foreign Application Priority Data
Jun. 29, 2020   (CN) .......................... 202010609666.2

(51) Int. Cl.
*H01L 23/538*   (2006.01)
*H01L 21/48*   (2006.01)
(52) U.S. Cl.
CPC ...... *H01L 23/5389* (2013.01); *H01L 21/4857* (2013.01); *H01L 23/5383* (2013.01); *H01L 23/5386* (2013.01)

(58) Field of Classification Search
CPC ............. H01L 23/5389; H01L 21/4857; H01L 23/5383; H01L 23/5386
See application file for complete search history.

(56) References Cited

U.S. PATENT DOCUMENTS

| | | | |
|---|---|---|---|
| 2006/0191711 A1* | 8/2006 | Cho | H01L 24/82 174/260 |
| 2014/0103527 A1* | 4/2014 | Marimuthu | H01L 23/3128 257/737 |
| 2020/0251415 A1* | 8/2020 | Kim | H01L 23/5383 |
| 2020/0388600 A1* | 12/2020 | Huang | H01L 23/315 |

* cited by examiner

*Primary Examiner* — Fernando L Toledo
*Assistant Examiner* — Neil R Prasad
(74) *Attorney, Agent, or Firm* — Grossman, Tucker, Perreault & Pfleger PLLC; Paul J. Kroon, Jr.

(57) ABSTRACT

Disclosed are a package structure of an integrated passive device and a manufacturing method thereof and a substrate. The method includes: providing an organic frame having a chip embedding cavity and a metal pillar, laminating at least one layer of first dielectric on an upper surface of the organic frame, and processing the first dielectric by photolithography to form an opening correspondingly above the chip embedding cavity; mounting an electronic component in the chip embedding cavity through the opening, the electronic component including an upper and lower electrodes; laminating and curing a second dielectric into the chip embedding cavity and on an upper surface of the first dielectric, thinning the first and second dielectrics to expose the upper and lower electrodes, upper and lower surfaces of the metal pillar; performing metal electroplating to form a circuit layer communicated with the upper and lower electrodes and the metal pillar.

7 Claims, 8 Drawing Sheets

PACKAGE STRUCTURE OF INTEGRATED PASSIVE DEVICE AND MANUFACTURING METHOD THEREOF, AND SUBSTRATE

CROSS-REFERENCE TO RELATED APPLICATIONS

This application is based on and claims the benefit of priority from Chinese Patent Application No. 2020106096662, filed on 29 Jun. 2020, the content of which is incorporated by reference herein in its entirety.

TECHNICAL FIELD

The present application relates to the technical field of semiconductor packaging, and in particular to a package structure of an integrated passive device and a manufacturing method thereof and a substrate.

BACKGROUND

With the continuous development of microelectronics technology, the number of ultra-small and ultra-thin products such as portable electronic products and digital products for high-speed information transmission and reception has increased dramatically. As a result, the requirements for high-density packaging technology are getting higher and higher. When the high-density packaging technology is adopted, a large number of components are required to be arranged and mounted on the surface of a printed circuit board (PCB) and to be patterned in high precision and thinned to form a multi-layer structure. However, with the improvement of product integration, it is more and more difficult to fabricate high-density circuit boards. Therefore, embedding a large number of passive components into the PCB may provide a shortened circuit length between components, improved electrical characteristics, an increased effective packaging area of the PCB, a greatly reduced number of solder points on the PCB surface, improved packaging reliability, and a reduced cost.

At present, all commercially available embedded components are arranged horizontally in the PCB. The arrangement density of the components per unit surface area is relatively limited due to the large length and size thereof, which cannot meet the requirements of miniaturization and integration of package substrates.

SUMMARY

The present application aims at solving one of the technical problems in the related art at least to certain extent. For this purpose, the present application proposes a package structure of an integrated passive device and a manufacturing method thereof, and a substrate. The following is the summary of the subject matters described in detail herein. This summary is not intended to limit the protection scope defined by the claims. The technical solutions are described as follows.

In a first aspect, an embodiment of the present application provides a method for manufacturing a package structure of an integrated passive device, including:

providing an organic frame having a chip embedding cavity and a metal pillar, laminating at least one layer of first dielectric on an upper surface of the organic frame, and processing the at least one layer of first dielectric by photolithography to form an opening which is correspondingly formed above the chip embedding cavity;

mounting an electronic component in the chip embedding cavity through the opening, the electronic component including an upper electrode and a lower electrode which are located at an upper portion and a lower portion of the chip embedding cavity, respectively;

laminating and curing a second dielectric into the chip embedding cavity and on an upper surface of the first dielectric, and thinning the first dielectric and the second dielectric to expose the upper electrode, the lower electrode, and upper and lower surfaces of the metal pillar; and performing metal electroplating to form a circuit layer communicated with the upper electrode, the lower electrode and the metal pillar.

The method for manufacturing a package structure of an integrated passive device according to an embodiment of the first aspect of the present application at least has the following beneficial effects: firstly, according to the present application, the passive electronic components are vertically embedded into a substrate to greatly shorten the arrangement distance thereof in the horizontal direction, improve the arrangement density thereof per unit area of the substrate, shorten the wiring distance and increase the capacity per unit area for the electronic components, thus realizing the miniaturization of a package substrate; secondly, according to the present application, the passive electronic components of different models and sizes can be packaged simultaneously in an integrated way, thus improving the diversification and integration of substrate functions.

Optionally, in one embodiment of the present application, the method further includes: forming a metal seed layer on an upper and lower surfaces of the organic frame respectively, wherein the metal seed layer covers the upper electrode, the lower electrode and the surfaces of the metal pillar.

Optionally, in one embodiment of the present application, the method further includes: removing the photosensitive barrier layer, etching the metal seed layer, depositing a solder mask on the upper and lower surfaces, respectively, and processing the solder mask by photolithography to form an electrode window for the circuit layer.

Optionally, in one embodiment of the present application, there is at least one chip embedding cavity, at least one metal pillar and at least one electronic component, respectively.

Optionally, in one embodiment of the present application, the electronic component is of one or more types.

Optionally, in one embodiment of the present application, the thinning the first dielectric and the second dielectric includes at least one of:

thinning the first dielectric and the second dielectric by plasma etching;

thinning the first dielectric and the second dielectric by polishing with a grinding plate;

thinning the first dielectric and the second dielectric by laser drilling; and thinning the first dielectric and the second dielectric by any combination of plasma etching, polishing with a grinding plate, and laser drilling.

Optionally, in one embodiment of the present application, the opening is a stepped opening.

Optionally, in one embodiment of the present application, the method further includes: connecting a plurality of the organic frames by connectors formed by laminating a plurality of layers of second dielectric, etching each layer of second dielectric and electroplating the metal pillar and the circuit layer on the each layer of second dielectric, to realize a multi-layer packaging of electronic components.

In a second aspect, an embodiment of the present application provides a package structure of an integrated passive device, including:

an organic frame including at least one chip embedding cavity, at least one metal pillar, and an organic dielectric filled within the organic frame;

an electronic component vertically mounted in the chip embedding cavity, the electronic component including an upper electrode and a lower electrode which are located at an upper portion and a lower portion of the chip embedding cavity respectively; and a circuit layer covering an upper and lower surfaces of the organic frame and communicated with the upper electrode, the lower electrode and the metal pillar.

The package structure of an integrated passive device according to an embodiment of the second aspect of the present application at least has the following beneficial effects: firstly, according to the present application, the passive electronic components are vertically embedded into a substrate to greatly shorten the arrangement distance thereof in the horizontal direction, improve the arrangement density thereof per unit area of the substrate, shorten the wiring distance and increase the capacity per unit area for the electronic components, thus realizing the miniaturization of a package substrate; secondly, according to the present application, the passive electronic components of different models and sizes can be packaged simultaneously in an integrated way, thus improving the diversification and integration of substrate functions.

In a third aspect, an embodiment of the present application provides a substrate, including the package structure of an integrated passive device as described in the second aspect.

The substrate according to an embodiment of the third aspect of the present application at least has the following beneficial effects: firstly, according to the present application, the passive electronic components are vertically embedded into a substrate to greatly shorten the arrangement distance thereof in the horizontal direction, improve the arrangement density thereof per unit area of the substrate, shorten the wiring distance and increase the capacity per unit area for the electronic components, thus realizing the miniaturization of a package substrate; secondly, according to the present application, the passive electronic components of different models and sizes can be packaged simultaneously in an integrated way, thus improving the diversification and integration of substrate functions.

Other features and advantages of the present application will be described in the following description, and partly become apparent from the description or shall be understood by implementing the present application. The purposes and other advantages of the present application can be realized and obtained through the structures specifically specified in the specification, claims and drawings.

BRIEF DESCRIPTION OF THE DRAWINGS

The accompanying drawings are used to provide further understanding of the technical solution of the present application, and constitute part of the specification. The accompanying drawings are used to, together with the embodiments of the present application, explain the technical solution of the present application, and do not constitute any limitation to the technical solution of the present application.

FIG. 20 is a sectional view of the package structure of an integrated passive device according to another embodiment of the present application, in which:

Figure 1:
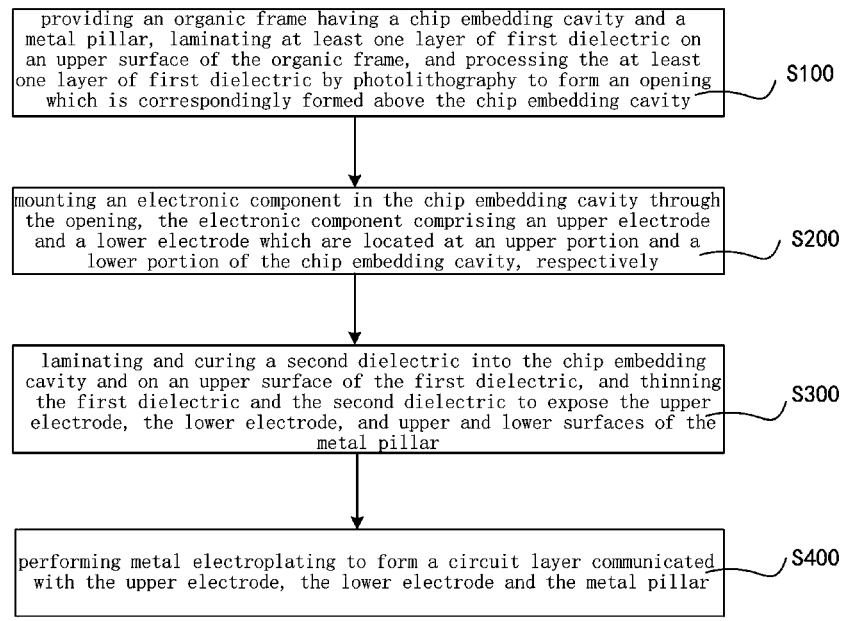
FIG. 1 is a flowchart of steps of a method for manufacturing a package structure of an integrated passive device according to an embodiment of the present application.

100: organic frame; 120: chip embedding cavity; 130: metal pillar; 130*a*: second metal pillar, 130*b*: third metal pillar; 200: first dielectric; 210: stepped opening; 300: electronic component; 310: upper electrode; 320: lower electrode; 400: second dielectric; 500: circuit layer, 500*a*: second circuit layer; 500*b*: third circuit layer; 600: metal seed layer; 700: solder mask; 710: electrode window; and 800: photosensitive barrier layer.

DETAILED DESCRIPTION

In order to make the purposes, technical solutions and advantages of the present application clearer, the present application will be further described below in detail with reference to the accompanying drawings and the embodiments. It should be understood that the specific embodiments to be described here are only used to explain the present application, not to limit the present application, and therefore have no technical substantive meaning. Any structural modification, proportional change or size adjustment shall be within the scope of the technical content disclosed in the present application without affecting the effects and purposes that can be achieved by the present application.

This section will describe the specific embodiments of the present application in detail. The preferred embodiments of the present application are shown in the drawings. The drawings are provided to supplement, with graphics, the description of the text part of the specification, so that people can intuitively and visually understand technical features and overall technical solution of the present application, and should not be understood as any limitation to the protection scope of the present application.

In the description of the present application, "several" means "one or more"; "a plurality of" means "two or more"; "greater than", "less than", "exceeding" or the like should be considered as excluding the number; and "above", "below", "within" or the like should be considered as including the number. Terms "first" and "second" are used only for the purpose of distinguishing the technical features, and should not be understood as indicating or implying relative importance or implicitly indicating the number of the stated technical features or implicitly indicating the precedence of the stated technical features.

Figure 3:
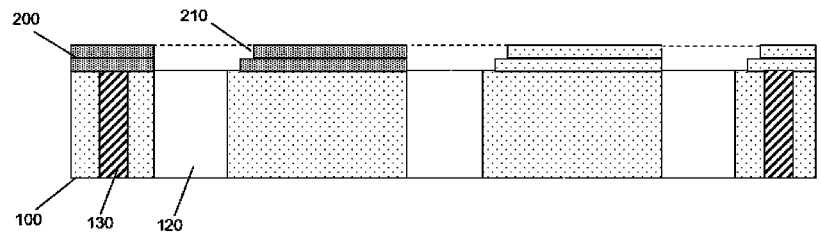

With reference to FIGS. 1 and 3, a method for manufacturing a structure with embedded inductors and capacitors according to an embodiment of the present application includes following steps.

Figure 2:
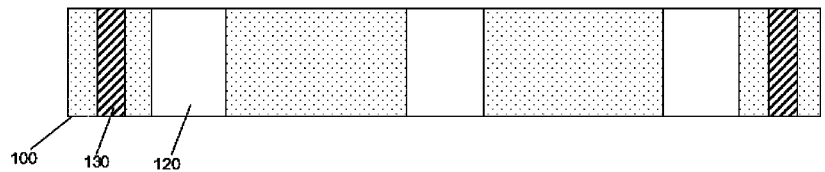
FIGS. 2-8 are sectional views of the intermediate state of a method for manufacturing a package structure of an integrated passive device according to another embodiment of the present application.

At S100: An organic frame 100 having a chip embedding cavity 120 and a metal pillar 130 is provided. At least one layer of first dielectric 200 is laminated on an upper surface of the organic frame 100, and is processed by photolithography to form a stepped opening 210 which is correspondingly formed above the chip embedding cavity 120. Specifically, as shown in FIG. 2, the organic frame 100 is provided with an upper surface and a lower surface and at least one conductive metal pillar 130, and the chip embedding cavities 120 arranged in an array are formed according to the size of the embedded electronic components. There may be at least one or more chip embedding cavities 120 designed according to actual needs. As shown in FIG. 3, the first dielectric 200 is laminated twice on the upper surface of the organic frame 100, and patterned by exposure and development to form discrete stepped layers, and the stepped opening 210 disposed above the chip embedding cavity 120 is formed between every two stepped layers. It should be noted that the stepped opening 210 is provided to facilitate the inclined and offset mounting of the electronic component 300 into the chip embedding cavity 120. The number of steps of the stepped opening 210 depends on the actual situation such as the size of the electronic component 300 to be mounted, and may be greater than or equal to 1. Preferably, in the present application, the number of steps of the stepped opening 210 is 2, i.e., the first dielectric 200 is laminated twice.

Figure 4:
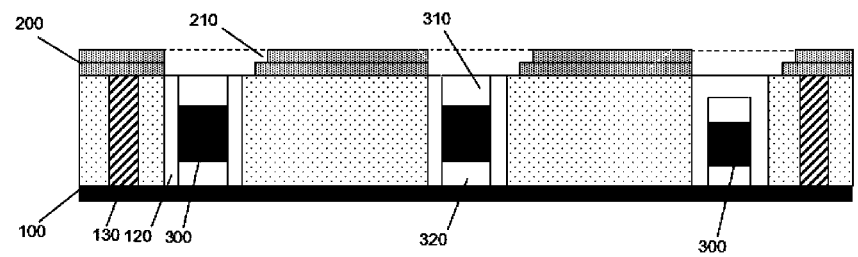

At S200: The electronic component 300 is mounted in the chip embedding cavity 120 through the stepped opening 210. The electronic component 300 includes an upper electrode 310 and a lower electrode 320 which are located at an upper portion and a lower portion of the chip embedding cavity 120, respectively. Specifically, as shown in FIG. 4, a tape is first attached to a lower surface of the organic frame 100 to temporarily seal the lower surface of the organic frame 100, and the electronic component 300 is partially attached to the steps through offset mounting and then slides down the steps to the bottom of the chip embedding cavity 120 under the action of gravity. When the electronic component 300 is mounted on the bottom of the chip embedding cavity 120, the lower electrode 320 is in contact with the tape. It should be noted that the electronic component 300 may be a discrete passive device such as a resistor, a capacitor or an inductor, or any combination of discrete passive devices.

Figure 5:
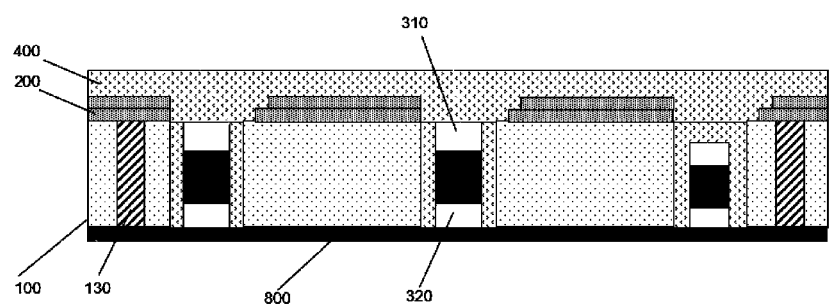
Figure 6:
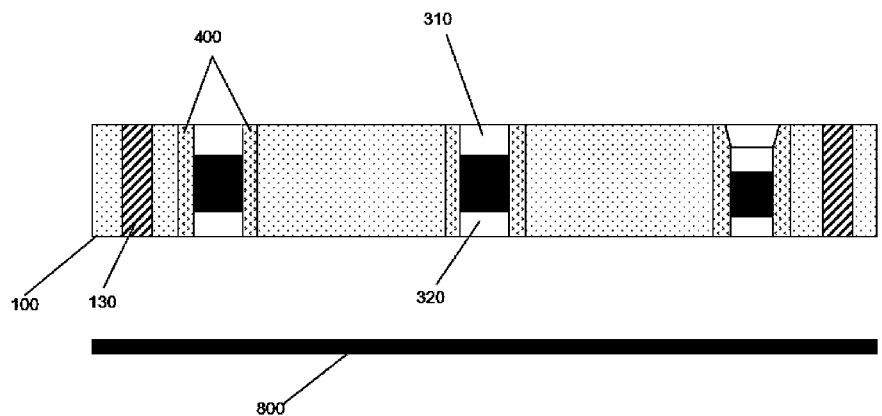
Figure 7:
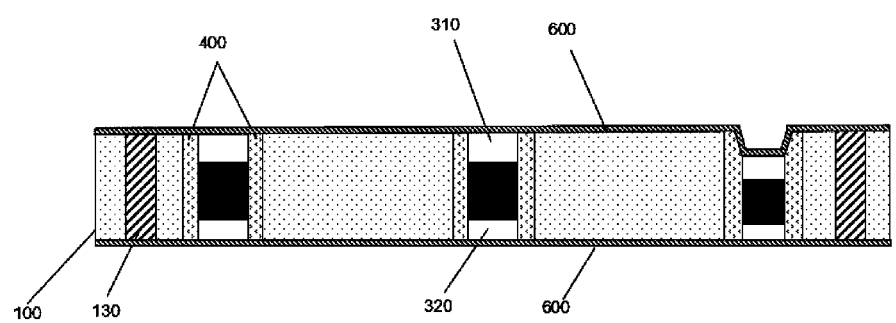

At S300: A second dielectric 400 is laminated into the chip embedding cavity 120 and on an upper surface of the first dielectric and cured. The first dielectric 200 and the second dielectric 400 are thinned to expose the upper electrode 310, the lower electrode 320, and upper and lower surfaces of the metal pillar 130. As shown in FIG. 5, the second dielectric 400 is laminated on the upper surface of the organic frame 100 until the second dielectric 400 fills a space in the chip embedding cavity 120 outside the electronic component 300, so that the second dielectric 400 completely covers the electronic component 300 and the stepped layers formed by the first dielectric 200, and thermal curing is performed. The purpose of thermal curing is to harden the materials of the first dielectric 200 and the second dielectric 400, so as to facilitate subsequent processes. As shown in FIG. 6, the hardened first dielectric 200 and second dielectric 400 are thinned to expose the upper electrode 310 of the electronic component 300 and the upper surface of the metal pillar 130 of the organic frame 100, and the tape attached to the lower surface of the organic frame 100 is further removed to expose the lower electrode 320 of the electronic component 300 and the lower surface of the metal pillar 130 of the organic frame 100. It should be noted that the first dielectric 200 and the second dielectric 400 may be thinned in several ways, such as by plasma etching, polishing with a grinding plate physically, laser drilling, or any combination of plasma etching, polishing with a grinding plate and laser drilling. Preferably, in one embodiment of the present application, the thinning process is performed by a combination of plasma etching and laser drilling. As shown in FIG. 7, metal seed layers 600 are formed on the upper and lower surfaces of the organic frame 100, respectively, and cover the surfaces of the upper electrode 310, the lower electrode 320 and the metal pillar 130. It should be noted that the metal seed layers 600 are deposited on the upper and lower surfaces of the thinned organic frame 100 to cover the upper and lower surfaces as well as walls of all through holes and blind holes, so as to realize the electrical connection. The metal seed layer 600 may be deposited by physical sputtering and chemical plating. Preferably, in one embodiment of the present application, the metal seed layer 600 is deposited by physical sputtering. The thickness of the metal seed layer 600 is determined according to actual needs. In one embodiment of the present application, the thickness of the metal seed layer 600 ranges from 800 nm to 2000 nm.

It should be noted that the first dielectric 200 and the second dielectric 400 are made of organic material, including prepreg (PP), thin-film resin (ABF) or photosensitive resin. The prepreg and the thin-film resin may be thinned by plasma etching, polishing with a grinding plate or laser drilling, and the photosensitive resin may be thinned by exposure and development.

Figure 8:
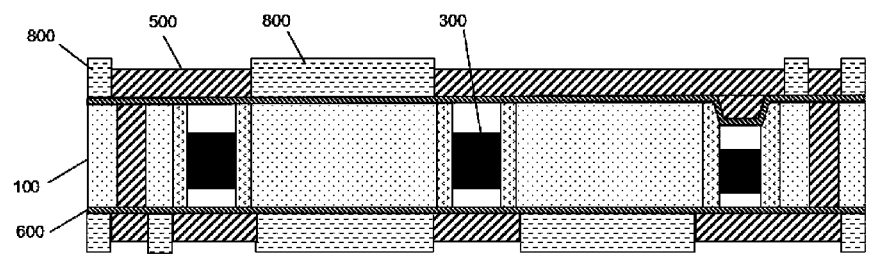
Figure 9:
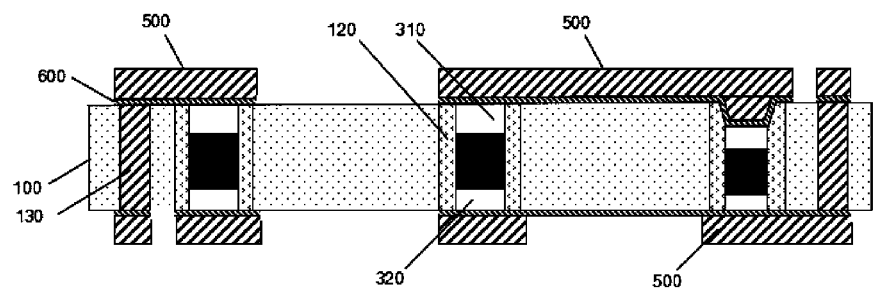
FIG. 9 is a sectional view of a package structure of an integrated passive device according to another embodiment of the present application.

At S400: Metal electroplating is performed to form circuit layers 500 communicated with the upper electrode 310, the lower electrode 320 and the metal pillar 130. Specifically, as shown in FIG. 8, photosensitive barrier layers 800 are attached to the upper and lower surfaces of the organic frame 100, and then patterned by photolithography to expose electroplated regions for the circuit layers 500. The upper and low surfaces are electroplated with metal to form the circuit layers 500 which cover the upper electrode 310 and the lower electrode 320 of the electronic component 300 and the upper and lower surfaces of the metal pillar 130. The thickness of the circuit layer 500 may be determined according to actual design needs. As shown in FIG. 9, the photosensitive barrier layers 800 on the upper and lower surfaces are removed, and the metal seed layers 600 are etched to be consistent with the circuit layers 500 so as to complete the vertical packaging of the single-layer passive electronic component 300. It should be noted that the purpose of depositing the metal seed layers 600 is to better connect the metal circuit layers 500 to the upper electrode and the lower electrode 320 of the electronic component 300 and the upper and lower surfaces of the metal pillar 130, thus improving the electrical characteristics.

It should be noted that, compared with the conventional structure of the electronic component 300 embedded horizontally, it is necessary to provide the stepped opening 210 for offset mounting of the vertical electronic component 300 due to its large length when the vertical electronic component 300 is packaged by embedding vertically. The height of the organic frame 100 may be adjusted according to the length of the vertical electronic component 300. In addition, there may be one or more vertical electronic components 300 packaged in the same layer to realize the integrated packaging of the electronic components 300 of the same model in the same layer, and there may be one or more types of the vertical electronic components 300 to realize the integrated packaging of the electronic components 300 of different models in the same layer as long as the size of the chip embedding cavity 120 can accommodate one of various vertical electronic components 300 with the largest length.

Figure 10:
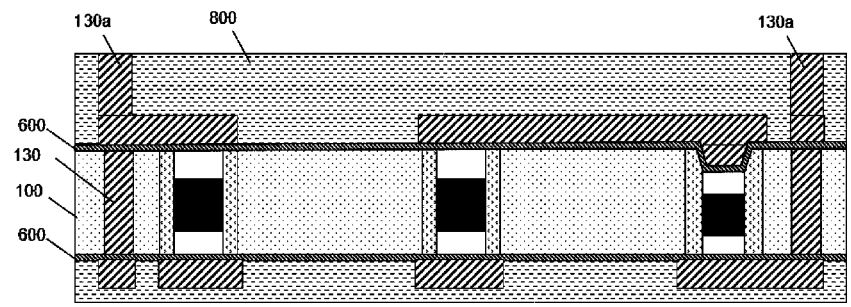
FIGS. 10-19 are sectional views of the intermediate state of the method for manufacturing a package structure of an integrated passive device according to another embodiment of the present application.
Figure 11:
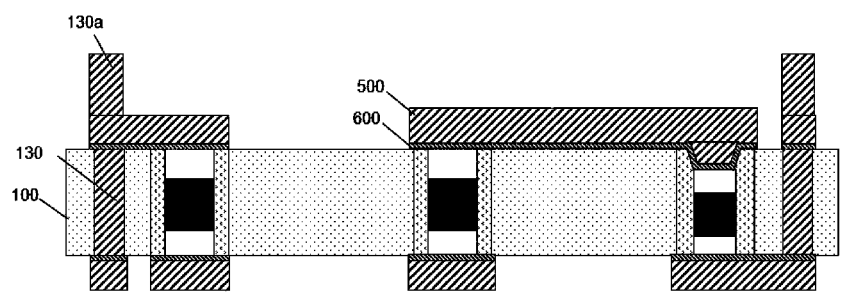
Figure 12:
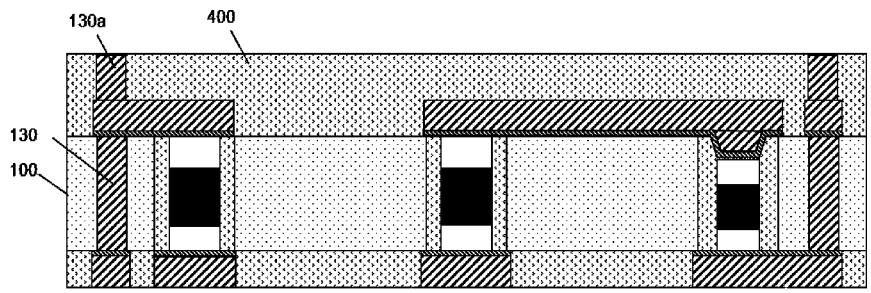
Figure 13:
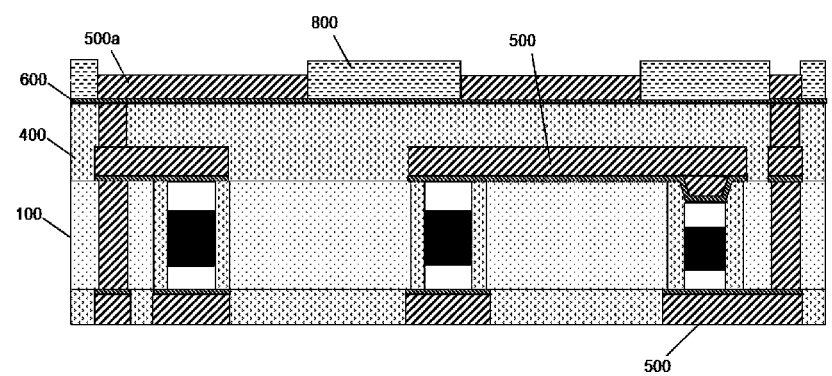
Figure 14:
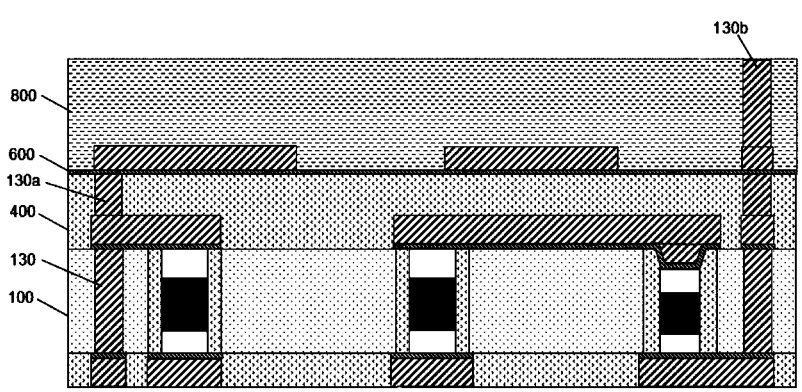
Figure 15:
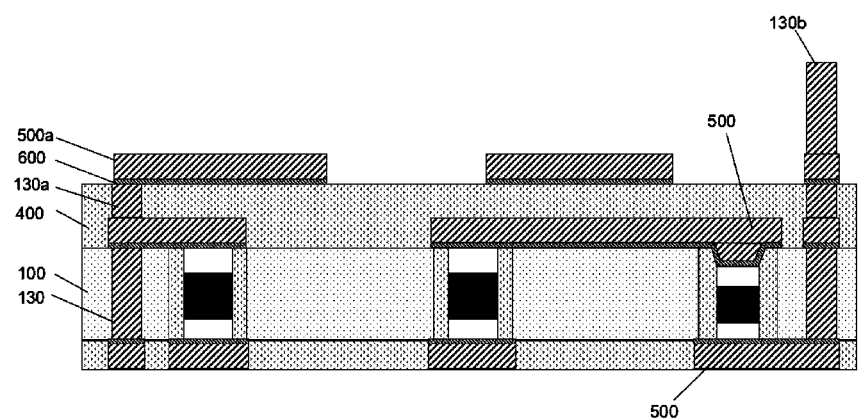
Figure 16:
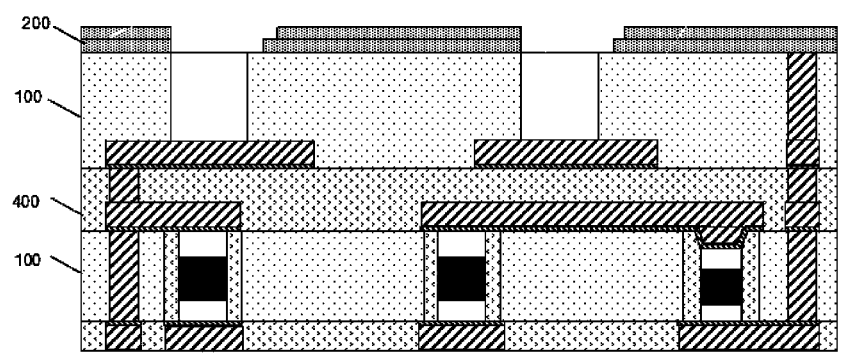
Figure 17:
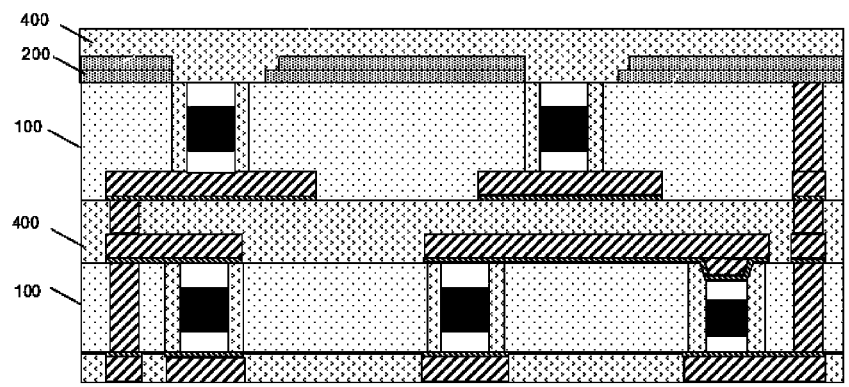
Figure 18:
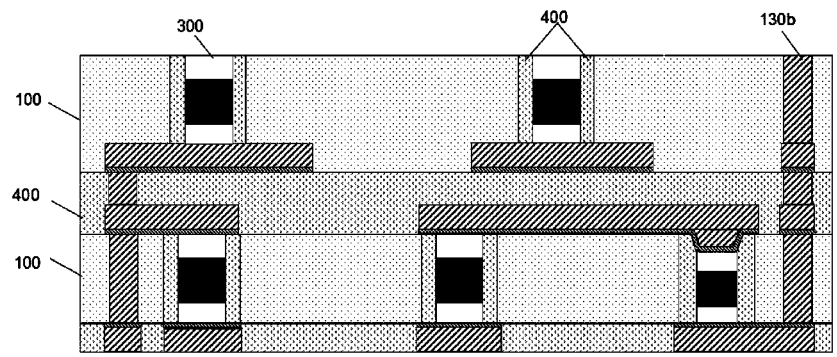
Figure 19:
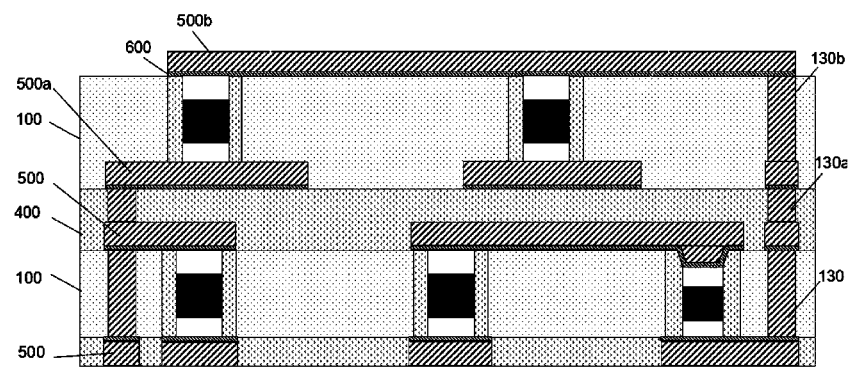
Figure 20:
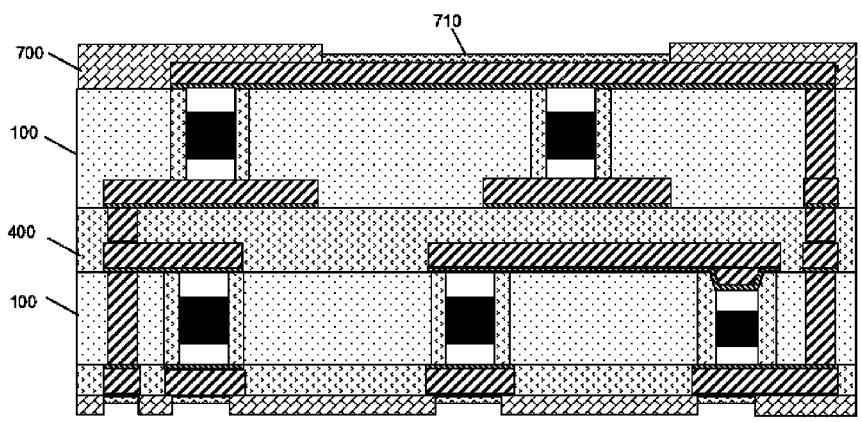

With reference to FIGS. 2 to 20, another embodiment of the present application also provides a method for manufacturing a package structure of an integrated passive device. As shown in FIG. 10, the photosensitive barrier layers 800 are continuously attached to the upper and lower surfaces of the structure shown in FIG. 8, and then patterned by photolithography to expose a second metal through hole. The second metal through hole is electroplated to form a second metal pillar 130a, thereby adding a layer. The second metal pillar 130a is connected to the surface of the circuit layer 500. It should be noted that double faces may be processed by photolithography and electroplated according to the design needs to form a double face layer-adding structure, or the layer may be added on a single face only to form a single face layer-adding structure. In one embodiment of the present application, the layer is added on a single face, as shown in FIG. 11, the photosensitive barrier layers 800 on the upper and lower surfaces are removed, and the metal seed layers 600 are etched to be consistent with the circuit layers 500. As shown in FIG. 12, the second dielectric 400 is laminated on the upper and lower surfaces of the structure shown in FIG. 11, respectively, and the second dielectric 400 is thinned so that the upper surface of the second metal pillar 130a is flush with the surface of the second dielectric 400. As shown in FIG. 13, the metal seed layer 600 and the photosensitive barrier layer 800 are formed successively on the upper surface of the structure shown in FIG. 12, and the photosensitive barrier layer 800 is processed by photolithography to form a second circuit layer window, and electroplated with metal to form a second circuit layer 500a on the surface of the second dielectric 400. It should be noted that the single-faced design or the double-faced design may be adopted, both of which fall within the scope of protection of the present application. In one embodiment of the present application, the single-faced design is adopted. As shown in FIG. 14, the photosensitive barrier layer 800 is attached to the upper surface of the structure shown in FIG. 13, and processed by photolithography and electroplated with metal to form a third metal pillar 130b. As shown in FIG. 15, the photosensitive barrier layer 800 is removed, and the metal seed layer 600 is etched to be consistent with the second circuit layer 500a. As shown in FIG. 16, an upper organic frame 100 is fabricated on the upper surface of the structure shown in FIG. 15. As shown in FIGS. 17 to 19, the electronic components 300 are mounted in the upper organic frame 100 to form a third circuit layer 500b, so as to realize a vertical packaging structure of the two-layer electronic components 300. It should be noted that the upper and lower electronic components 300 are electrically communicated through the circuit layer 500, the second circuit layer 500a, the third circuit layer 500b, the metal pillar 130, the second metal pillar 130a, and the third metal pillar 130b. In addition, two or more layers of electronic components 300 may be vertically packaged by adding layers on the single face or double faces according to design needs, which all fall within the protection scope of the present application. In one embodiment of the present application, the design of adding two layers on the single face is adopted. As shown in FIG. 20, solder masks 700 are deposited on the upper and lower surfaces of the structure shown in FIG. 19, and processed by photolithography to form an electrode window 710 for the circuit layer 500, and the electrical characteristics are led out to facilitate the connection of the electronic components 300 to the external circuit. Finally, the surface of the electrode window 710 is electroplated with rare metal for anti-oxidation treatment. The rare metals are chemically stable and corrosion resistant, which can prevent the electrode window 710 from being oxidized.

Based on the method for manufacturing a package structure of an integrated passive device, various embodiments of a package structure of an integrated passive device of the present application are proposed.

With reference to FIG. 9, another embodiment of the present application also provides a package structure of an integrated passive device, including an organic frame 100. There is at least one layer of the organic frame 100, including at least one chip embedding cavity 120, and at least one metal pillar 130; an electronic component 300 which is vertically mounted in the chip embedding cavity 120 and includes an upper electrode 310 and a lower electrode 320 located at an upper portion and a lower portion of the chip embedding cavity 120 respectively; circuit layers 500 covering the upper and lower surfaces of the organic frame 100 and communicating with the upper electrode 310, the lower electrode 320 and the metal pillar 130; and dielectric layers configured to connect the circuit layers 500 and the organic frame 100.

In one embodiment, the electronic component 300 is vertically mounted in the chip embedding cavity 120, and the upper electrode 310 and the lower electrode 320 of the electronic component 300 are located at the top and bottom of the chip embedding cavity 120. The circuit layers 500 are provided on the upper and lower surfaces of the organic frame 100, and are communicated with the upper electrode 310 and the lower electrode 320 of the electronic component 300. The size and quantity of the chip embedding cavities 120 may be adjusted according to the size, model and quantity of the electronic component 300. Both the integrated packaging of the electronic components 300 of the same model in the same layer and the integrated packaging of the electronic components 300 of different models in the same layer can be realized by vertically mounting a plurality of electronic components 300 in a plurality of chip embedding cavities 120. In one embodiment of the present application, two or more layers of electronic components 300 can be packaged vertically by adding two or more layers on the single face or double faces according to design needs, which all fall within the scope of protection of the present application.

Another embodiment of the present application also provides a substrate, including the package structure of an integrated passive device in any of the above embodiments.

The above is the specific description of preferred implementations of the present application, but the present application is not limited to the above-mentioned implementations. Those skilled in the art can make various equivalent modifications or replacements without departing from the principle of the present application, and those equivalent modifications or replacements shall fall within the scope defined by the claims of the present application.

What is claimed is:

1. A method for manufacturing a package structure of an integrated passive device, comprising:
providing an organic frame having a chip embedding cavity and a metal pillar, laminating at least one layer of first dielectric on an upper surface of the organic frame, and processing the at least one layer of first dielectric by photolithography to form an opening which is a stepped opening correspondingly formed above the chip embedding cavity;
mounting an electronic component in the chip embedding cavity through the opening, the electronic component comprising an upper electrode and a lower electrode which are located at an upper portion and a lower portion of the chip embedding cavity, respectively;

laminating and curing a second dielectric into the chip embedding cavity and on an upper surface of the first dielectric, and thinning the first dielectric and the second dielectric to expose the upper electrode, the lower electrode, and upper and lower surfaces of the metal pillar; and performing metal electroplating to form a circuit layer communicated with the upper electrode, the lower electrode and the metal pillar.

2. The method for manufacturing a package structure of an integrated passive device of claim 1, further comprising: forming a metal seed layer on an upper and lower surfaces of the organic frame respectively, wherein the metal seed layer covers the upper electrode, the lower electrode and the surfaces of the metal pillar.

3. The method for manufacturing a package structure of an integrated passive device of claim 2, further comprising: etching the metal seed layer, depositing a solder mask on the upper and lower surfaces, respectively, and processing the solder mask by photolithography to form an electrode window for the circuit layer.

4. The method for manufacturing a package structure of an integrated passive device of claim 1, wherein there is at least one chip embedding cavity, at least one metal pillar and at least one electronic component, respectively.

5. The method for manufacturing a package structure of an integrated passive device of claim 4, wherein the electronic component is of one or more types.

6. The method for manufacturing a package structure of an integrated passive device of claim 1, wherein the thinning the first dielectric and the second dielectric comprises at least one of:

thinning the first dielectric and the second dielectric by plasma etching;

thinning the first dielectric and the second dielectric by polishing with a grinding plate;

thinning the first dielectric and the second dielectric by laser drilling; and thinning the first dielectric and the second dielectric by any combination of plasma etching, polishing with a grinding plate, and laser drilling.

7. The method for manufacturing a package structure of an integrated passive device of claim 1, further comprising: connecting a plurality of the organic frames by connectors formed by laminating a plurality of layers of second dielectric, etching each layer of second dielectric and electroplating the metal pillar and the circuit layer on the each layer of second dielectric, to realize a multi-layer packaging of electronic components.

* * * * *